United States Patent [19]

Ohji et al.

[11] Patent Number: 5,051,381
[45] Date of Patent: Sep. 24, 1991

[54] POWDERY COATING GLASS MATERIAL, COATING GLASS PASTE USING THE SAME AND COATING GLASS COMPOSITION PREPARED THEREBY

[75] Inventors: Masahiko Ohji; Norikazu Fukushima, both of Shiga, Japan

[73] Assignee: Nippon Electric Glass Co., Ltd., Otsu, Japan

[21] Appl. No.: 515,414

[22] Filed: Apr. 27, 1990

[30] Foreign Application Priority Data

Apr. 28, 1989 [JP] Japan .................. 1-110618

[51] Int. Cl.$^5$ .................. C03C 8/04; C03C 8/02; C03C 3/062; C03C 3/066
[52] U.S. Cl. .................. 501/26; 501/20; 501/21; 501/32; 501/73; 501/77; 501/79
[58] Field of Search .................. 501/20, 24, 26, 46, 501/47, 49, 75, 76, 77, 79, 21, 27, 32

[56] References Cited

U.S. PATENT DOCUMENTS

| | | |
|---|---|---|
| 3,258,434 | 6/1966 | Mackenzie et al. .................. 252/519 |
| 3,446,695 | 5/1969 | Janakirama-Rao .................. 161/192 |
| 3,520,831 | 7/1970 | Lodewijk et al. .................. 252/518 |
| 3,650,778 | 3/1972 | Dumesnil et al. .................. 106/47 R |
| 3,885,974 | 5/1975 | Asahara et al. .................. 106/47 Q |
| 4,544,974 | 10/1985 | West, Jr. et al. .................. 360/120 |
| 4,741,849 | 5/1988 | Naito et al. .................. 252/62.6 |
| 4,748,137 | 5/1988 | Nigrin .................. 501/46 |

*Primary Examiner*—William R. Dixon, Jr.
*Assistant Examiner*—Michael Marcheschi
*Attorney, Agent, or Firm*—Collard, Roe & Galgano

[57] ABSTRACT

A powdery coating glass material essentially consists of $V_2O_5$ 5–35 wt. %, ZnO 33–60 wt. %, $B_2O_3$ 3–25 wt. %, $SiO_2$ 1–15 wt. %, $Al_2O_3$ 0–5 wt. %, and at least one element 2–20 wt. % selected from the group consisting of MgO, CaO, SrO, and BaO, which coating glass material has a softening point of 600° C. or less. A coating glass composition is prepared by the above powdery coating glass material or a coating glass paste for use in a thick-film technique which contains the above powdery coating glass material. The prepared coating glass composition has a thermal expansion coefficient ranging from $55 \times 10^{-7}/°C$. to $75 \times 10^{-7}/°C$.

5 Claims, 1 Drawing Sheet

POWDERY COATING GLASS MATERIAL, COATING GLASS PASTE USING THE SAME AND COATING GLASS COMPOSITION PREPARED THEREBY

BACKGROUND OF THE INVENTION

1. Field of the Invention

The present invention relates to a powdery coating glass material and a coating glass paste for use as a coating to protect thick film print circuits used in electronic parts, and a coating glass composition prepared by the coating glass material and glass paste, and in particular to (i) a $ZnO-V_2O_5-B_2O_3-SiO_2$ based powdery coating glass material, (ii) a coating glass paste using the powdery coating glass material which is particularly improved in that it is hardly reduced in the course of the firing thereof for the formation of a coating glass composition in a nitrogen atmosphere, and (iii) the coating glass composition prepared by the above coating glass material and glass paste. By the use of the powdery coating glass material, the coating glass paste or the coating glass composition, the use of copper as a material for conductors, which is easily oxidized, but superior in electrical characteristics and reliability to conventionally employed materials, becomes possible.

2. Description of the Prior Art

A thick film print circuit comprising resistors and conductors formed on a ceramic substrate requires protection from external electrical, chemical, and mechanical damage. Glass is commonly used as a coating material to provide such protection.

Conventionally, silver-palladium is mainly used as a conductive material, but in recent years, as technological advances in the manufacture of electronic parts have made rapid progress, the necessity for high densification of the circuitry has arisen. The use of copper has been proposed because its electrical characteristics and reliability are superior to silver-palladium. However, copper is so easily oxidized that the firing of a circuit comprising a copper conductor for the protection thereof with a coating glass composition has to be carried out in an non-oxidizing atmosphere, such as in an atmosphere of nitrogen.

As such coating glass compositions, conventionally a $PbO-B_2O_3-SiO_2$ based glass composition as disclosed in Japanese Patent Publication 63-10104, a $ZnO-B_2O_3-SiO_2$ based glass composition as disclosed in Japanese Laid-Open Patent Application 62-31903, and a $CdO-B_2O_3-SiO_2$ based glass composition have been proposed.

However, when the $PbO-B_2O_3-SiO_2$ based glass composition is fired for the formation of a glass coating on circuits in a nitrogen atmosphere, the lead oxide contained in the composition is easily reduced and lead is separated out so that the characteristics of the glass coating are subject to radical deterioration.

When the $ZnO-B_2O_3-SiO_2$ based glass composition is used as a coating composition, the resistance of the coated resistors varies considerably before and after the coating, that is, the resistance changing rate thereof is significantly high. Because of this high resistance changing rate, there is the problem of difficulty in setting a desired resistance of the resistor.

In the case of the $CdO-B_2O_3-SiO_2$ based glass composition there is concern about adverse effects on the human body from the use of CdO, as well as the fact that this material is not desirable because of its potential for environmental pollution.

SUMMARY OF THE INVENTION

It is therefore an object of the present invention to provide a powdery coating glass material for use as a coating material which is hardly reduced on firing in a nitrogen atmosphere so that copper can be used as a conductor to be protected, has a low resistance changing rate, and a softening point of 600° C. or less, and presents no problems with respect to injury to humans or damage to the environment.

Another object of the present invention is to provide a coating glass paste prepared by using the above powdery coating material.

A further object of the present invention is to provide a coating glass composition prepared by the above coating glass material or glass paste, which has a softening point of 600° C. or less and a thermal expansion coefficient of $55-75 \times 10^{-7}/°$ C., and which has superior durability against water.

According to the present invention, there are provided a powdery coating glass material essentially consisting of $V_2O_5$ 5–35%, ZnO 33–60%, $B_2O_3$ 3–25%, $SiO_2$ 1–15%, $Al_2O_3$ 0–5%, and at least one element 2–20% selected from the group consisting of MgO, CaO, SrO, and BaO, and a coating glass paste which is prepared by use of the above powdery coating glass material.

DESCRIPTION OF PREFERRED EMBODIMENTS

Figure 1:
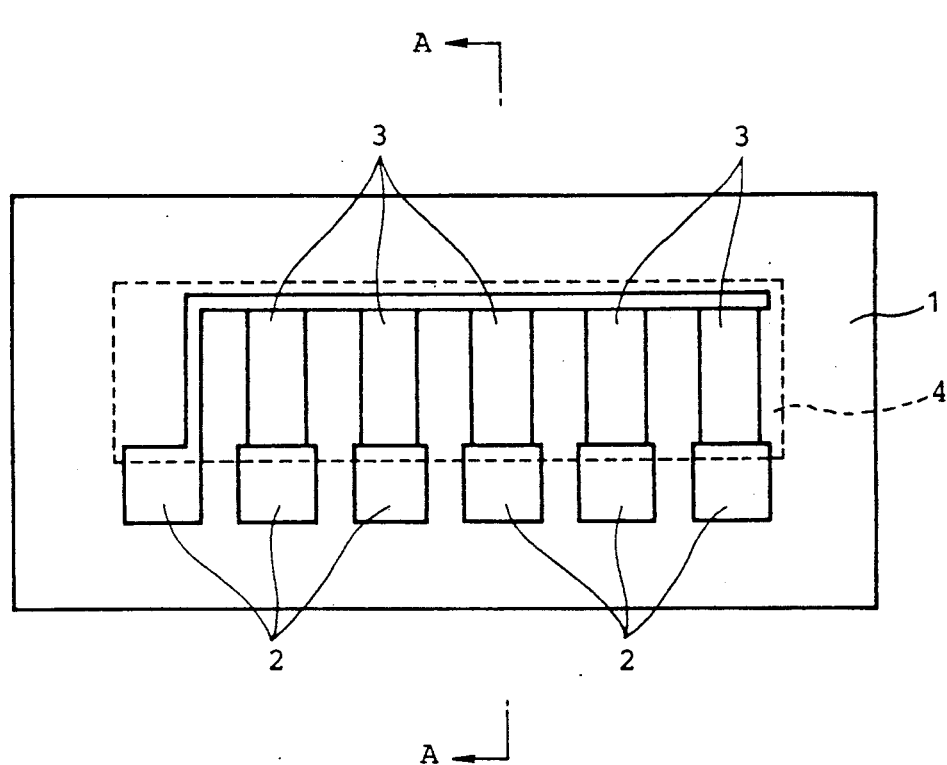
FIG. 1 is a plan view of an alumina substrate on the surface of which a test circuit has been formed and coated with a coating glass composition prepared by a powdery coating glass material according to the present invention.

When circuits are fired at high temperatures after they have been coated with a coating glass material, the electric characteristics of the circuits generally deteriorate. It is therefore desirable that the coating glass material have as low a softening point as possible. Specifically, a coating glass material with a softening point of 600° C. or less is desirable. Furthermore, when the circuits are formed on an aluminum substrate, it is preferable that the thermal expansion coefficient of the coating glass material be compatible with that of alumina, specifically, $55 \times 10^{-7}$ to $75 \times 10^{-7}/°$ C.

In addition, if the coating glass material has poor durability against water or moisture, it lacks reliability when the circuits are operated under conditions of high humidity. Therefore it is necessary that the coating glass material have superior durability against water.

The powdery coating glass material according to the present invention essentially consists of $V_2O_5$ 5–35%, ZnO 33–60%, $B_2O_3$ 3–25%, $SiO_2$ 1–15%, $Al_2O_3$ 0–5%, and at least one element 2–29% selected from the group consisting of MgO, CaO, SrO, and BaO preferably $V_2O_5$ 6–30%, ZnO 35–57%, $B_2O_3$ 5–19%, $SiO_2$ 3–12%, $Al_2O_3$ 0–4%, and at least one element 2–19% selected from the group consisting of MgO, CaO, SrO, and BaO, and have a softening point of 600° C. or less.

In the present invention, $V_2O_5$ is network forming oxide. The content in the powdery coating glass material is 5-35 wt. %, preferably 6-30 wt. %. If the content is less than 5 wt. %, the resistance changing rate is too high for use in the present invention; if greater than 35 wt. %, vitrification does not occur but, rather, a devitrified material is formed.

ZnO serves as an intermediate oxide in the present invention. The content in the powdery coating glass material is 33-60 wt. %, preferably 35-57 wt. % content is less than 33 wt. %, the softening point of the coating glass material increases and the fluidity thereof becomes poor when fired so that a good coating cannot be obtained; if greater than 60 wt. %, the coating glass material devitrifies easily.

$B_2O_3$ is also network forming oxide and served as a flux agent. The content in the powdery coating glass material is 3-25 wt. %, preferably 5-19%. If the content is less than 3 wt. %, its effect as a flux agent is diminished and vitrification does not occur; if greater than 25 wt. %, the durability against water or moisture is drastically reduced and the object of circuit protection is difficult to achieve.

$SiO_2$ is also network forming oxide and provide good durability against water as well as a low resistance changing rate. The content in the powder coating glass material is 1-15 wt. %, preferably 3-12 wt. %. If the content is less than 1 wt. %, the above effects are diminished; if greater than 15 wt. %, the softening point of the coating glass material increases and the fluidity thereof becomes poor when fired so that a good coating cannot be obtained.

$Al_2O_3$ serves as an intermediate oxide. As with $SiO_2$, it is added to provide good durability against water. The content in the powder coating glass material is 0-5 wt. %, preferably 0-4 wt. %. If the content is more than 5 wt. %, the softening point of the coating glass material increases and the fluidity thereof becomes poor when fired so that a good coating cannot be obtained.

MgO, CaO, SrO, and BaO are network modifying oxides for more delicate adjustment of the properties of the coating glass material according to the present invention. More specifically, they are included in the powder coating glass material to increase the thermal expansion coefficient with a content of 2-20 wt. %, preferably 3-19 wt. %. If the content is less than 2 wt. %, the thermal expansion coefficient becomes too low and the coating glass material is no longer suitable for use with a ceramic substrate; if greater than 20 wt. %, the glass devitrifies easily.

The inclusion of $V_2O_5$ in the powder coating glass material according to the present invention causes the glass to take on a brown coloration. For this reason, up to 25 wt. % $CeO_2$ or $TeO_2$ can be included as a decolorant. In addition, up to 5 wt. % $As_2O_3$ or $Sb_2O_3$ can be added as a clarifying agent.

The present invention will now be explained in more detail with reference to the following examples.

EXAMPLE 1

The following components were mixed and placed in a platinum crucible and melted at about 1300° C. to form a melted glass:

|  | wt. % |
|---|---|
| $V_2O_5$ | 29 |
| ZnO | 39 |
| $B_2O_3$ | 17 |
| $SiO_2$ | 11 |

-continued

|  | wt. % |
|---|---|
| MgO | 4 |

The thus obtained melted glass was cast in the form of a film on a water-cooled roller and this glass film was finely pulverized in an alumina ball mill to obtain a powdery coating glass material No. 1 according to the present invention was obtained.

The softening point of the powdery coating glass material No. 1 was measured by a differential thermal analyzer. The result is shown in the accompanying single Table.

The thus obtained powdery coating glass material No. 1 was sintered and the thermal expansion coefficient of the resulting glass composition was measured by a dilatometer. The result is shown in the Table.

The powdery coating glass material No. 1 and a vehicle prepared by dissolving an acrylic heat-decomposable binder in terpineol were kneaded in a three-roll mill to prepare coating glass paste.

Figure 2:
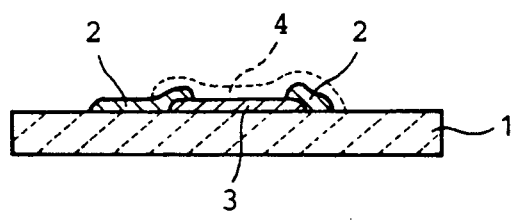
FIG. 2 is a sectional view taken along line A—A' in FIG. 1.

This coating glass paste was then coated by screen printing onto an alumina substrate on which test circuits made of copper conductor and ruthenium oxide resistor had been formed as shown in FIGS. 1 and 2. The coating glass paste coated substrate including the test circuits was fired in a nitrogen atmosphere at about 590° C. for about 10 minutes, whereby a circuit board No. 1 as shown in FIGS. 1 and 2 was prepared. FIG. 1 is a plan view of the circuit board and FIG. 2 is a schematic cross-sectional view thereof, in which reference numeral 1 indicates an alumina substrate; reference numeral 2, a conductor made of copper; reference numeral 3, a resistor made of ruthenium oxide; and reference numeral 4, the fixed coating composition.

This circuit board was used to measure the durability against water and the resistance changing ratio of the resistors, and a visual observation of the color tone of the coating glass composition was also made.

The durability against water of the coating glass composition was measured on the alumina substrate, on which the paste had been fired, by enclosing the sample substrate in a pressure cooker test apparatus at 121° C., 2 atmospheric pressure and 100% RH for 20 hours, after which the brilliance of the glass surface of the coating glass composition was observed are evaluated visually.

The resistance changing rate was measured by the four-terminal method in which the resistance changing rate is expressed by the difference in the resistance value of resistors before and after the firing of the coating glass paste coated on the circuit board as a percentage of the value before the firing. The closer to zero, the better for this characteristic.

The results are shown in the Table.

EXAMPLES 2 to 8 and COMPARATIVE EXAMPLES 1 to 3

The procedure for Example 1 was repeated except that the formulation of the coating glass material in Example 1 was changed as shown in the Table, whereby circuit boards prepared by using powdery coating glass materials Nos. 2 to 8 according to the present invention and comparative circuit boards using comparative powdery coating glass materials Nos. 1 to 3 were prepared.

Thus, the softening point of each of the powdery coating glass material, and the thermal expansion coefficient, the color tone, and the resistance changing rate of resistors coated by the above powdery coating glass materials, were investigated in the same manner as in Example 1. The results are shown in the Table.

TABLE

|  | Sample No. | | | | | | | | | | (wt. %) |
|---|---|---|---|---|---|---|---|---|---|---|---|
|  | Examples | | | | | | | | Comparative Examples | | |
| Elements | 1 | 2 | 3 | 4 | 5 | 6 | 7 | 8 | 1 | 2 | 3 |
| $V_2O_5$ | 29 | 6 | 27 | 10 | 25 | 12 | 15 | 10 | — | — | — |
| ZnO | 39 | 57 | 47 | 55 | 50 | 41 | 35 | 44 | 60 | 60 | — |
| $B_2O_3$ | 17 | 17 | 13 | 18 | 5 | 7 | 8 | 8 | 20 | 24 | 15 |
| $SiO_2$ | 11 | 6 | 7 | 7 | 3 | 5 | 5 | 5 | 10 | 6 | 3 |
| $Al_2O_3$ | — | 3 | — | — | — | 1 | — | — | 2 | 1 | 7 |
| MgO | 4 | 5 | — | — | 17 | — | — | 6 | — | — | — |
| CaO | — | — | — | 10 | — | 7 | 18 | 10 | 5 | 9 | — |
| SrO | — | 6 | — | — | — | — | — | 2 | — | — | — |
| BaO | — | — | 6 | — | — | 12 | — | — | — | — | — |
| $TeO_2$ | — | — | — | — | — | 15 | 19 | — | — | — | — |
| $CeO_2$ | — | — | — | — | — | — | — | 15 | — | — | — |
| PbO | — | — | — | — | — | — | — | — | — | — | 75 |
| $Na_2O$ | — | — | — | — | — | — | — | — | 3 | — | — |
| Softening Point (°C.) | 600 | 580 | 545 | 595 | 575 | 565 | 550 | 570 | 585 | 590 | 480 |
| Thermal Expansion Coefficient [30-300° C.] ($\times 10^{-7}$/°C.) | 55 | 64 | 70 | 66 | 73 | 68 | 71 | 64 | 58 | 67 | 75 |
| Color Tone | Dark Brown | Brown | Dark Brown | Brown | Dark Brown | Light Yellow | Light Brown | Light Yellow | Colorless | Colorless | Unmeasurable |
| Durability Against Water | Good | Good | Good | Good | Good | Good | Good | Good | Good | Good | Unmeasurable |
| Resistance Changing Rate (%) | +1.4 | +3.2 | +0.5 | +2.7 | +0.9 | +1.1 | +0.7 | +1.2 | +85 | +55 | Unmeasurable |

As may be clearly understood from the Table, the powdery coating glass materials No. 1 to No. 8 according to the present invention have softening points of 600° C. or less, and the coating glass compositions made by these coating glass materials have thermal expansion coefficients of $55 \times 10^{-7}$ to $73 \times 10^{-7}$/° C. and excellent durability against water. The resistance changing ratio of resistors are low, ranging from +0.5 to +3.2. The values of all these characteristics are therefore seen to be excellent.

On the other hand, although Comparative Examples No. 1 to No. 3 are seen to be good in terms of the softening point, thermal expansion coefficient and durability against water, the resistance change ratio of resistors coated by Comparative Examples No. 2 and No. 3 were as high as +85 and +55, respectively, which are not desirable. Comparative Example 3 contained PbO as its main component. This component was reduced to Pb during the firing process and as a result there was inadequate glass coat formation. Measurement of the durability against water and the resistance changing rate, and visual observation of the color tone of the paste after firing could not be performed.

What is claimed is:

1. A powdery coating glass material consisting essentially of $V_2O_5$ 5-35 wt. %, ZnO 33-60 wt. %, $B_2O_3$ 3-25 wt. %, $SiO_2$ 1-15 wt. %, $Al_2O_3$ 0-5 wt. %, and at least one oxide 2-20 wt. % selected from the group consisting of MgO, CaO, SrO, and BaO, having a softening point of 600° C. or less.

2. A powdery coating glass material as claimed in claim 1, consisting essentially of $V_2O_5$ 6-30 wt. %, ZnO 35-57 wt. %, $B_2O_3$ 5-19 wt. %, $SiO_2$ 3-12 wt. %, $Al_2O_3$ 0-4 wt. %, and at least one oxide 3-19 wt. % selected from the group consisting of MgO, CaO, SrO, and BaO.

3. A coating glass paste as claimed in claim 1, wherein said powdery glass material consisting essentially of $V_2O_5$ 6-30 wt. %, ZnO 35-57 wt. %, $B_2O_3$ 5-19 wt. %, $SiO_2$ 3-12 wt. %, $Al_2O_3$ 0-4 wt. %, and at least one oxide 3-19 wt. % selected from the group consisting of MgO, CaO, SrO, and BaO.

4. A coating glass composition consisting essentially of $V_2O_5$ 5-35 wt. %, ZnO 33-60 wt. %, $B_2O_3$ 3-25 wt. %, $SiO_2$ 1-15 wt. %, $Al_2O_3$ 0-5 wt. %, and at least one oxide 2-20 wt. % selected from the group consisting of MgO, CaO, SrO, and BaO, having a thermal expansion coefficient ranging from $55 \times 10^{-7}$/° C. to $75 \times 10^{-7}$/° C.

5. A coating glass paste for use in a thick-film technique, which paste is to be fired in a nitrogen atmosphere and comprises a powdery glass material consisting essentially of $V_2O_5$ 5-35 wt. %, ZnO 33-60 wt. %, $B_2O_3$ 3-25 wt. %, $SiO_2$ 1-15 wt. %, $Al_2O_3$ 0-5 wt. %, and at least one oxide 2-20 wt. % selected from the group consisting of MgO, CaO, SrO, and BaO, and an organic vehicle consisting of a solution of an acrylic heat-decomposable binder in terpineol.

* * * * *